United States Patent [19]

Kenty

[11] 3,864,162

[45] Feb. 4, 1975

[54] METHOD OF FORMING GALLIUM ARSENIDE FILMS BY VACUUM EVAPORATION DEPOSITION

[75] Inventor: Joseph L. Kenty, Placentia, Calif.

[73] Assignee: Rockwell International Corporation, El Sequndo, Calif.

[22] Filed: Feb. 4, 1975

[21] Appl. No.: 379,521

[52] U.S. Cl. .............. 117/213, 117/106 A, 117/201

[51] Int. Cl. .............................................. C23c 13/04

[58] Field of Search ....... 117/106 A, 107, 201, 213; 148/175

[56] References Cited

UNITED STATES PATENTS

| | | | |
|---|---|---|---|
| 3,607,135 | 9/1971 | Gereth et al | 117/106 A X |
| 3,674,552 | 7/1972 | Heywane | 117/106 A X |

OTHER PUBLICATIONS

Powell et al, Vapor Deposition, Joan Wiley & Sons, New York, 1966, p. 632.

Manasevit, "Single-Crystal Gallium Arsenide on Insulating Substrates," Applied Physics Letters, Vol. 12, No. 4, 1968, pp 156–159.

*Primary Examiner*—Leon D. Rosdol
*Assistant Examiner*—Harris A. Pitlick
*Attorney, Agent, or Firm*—H. Frederick Hamann; G. Donald Weber, Jr.

[57] ABSTRACT

A method utilizing vacuum evaporation techniques for growing monocrystalline films of III-V compounds such as gallium arsenide on structurally dissimilar crystalline substrates. In a preferred embodiment, a single gallium arsenide source is heated to 900°–1000°C at a subatmospheric pressure of about $10^{-5}$ to $10^{-8}$ torr to evaporate gallium and arsenic therefrom for recombination on a smooth, clean single crystal sapphire ($\alpha$-alumina) substrate maintained at about 580°-595°C.

10 Claims, 1 Drawing Figure

METHOD OF FORMING GALLIUM ARSENIDE FILMS BY VACUUM EVAPORATION DEPOSITION

BACKGROUND OF THE INVENTION

1. Field of the Invention

This invention relates to methods for forming films of III–V compounds on substrates. More particularly, this invention relates to a physical vapor deposition process utilizing a gallium arsenide source to form an epitaxial monocrystalline film of gallium arsenide on substrates, typically comprising a metallic oxide material such as sapphire, that are of a dissimilar crystal structure.

2. Description of the Prior Art

Epitaxial techniques for the growth of films of compounds of elements from Groups III and V of the Periodic Table on crystalline substrates are becoming increasingly important. This is partially a result of the stringent physical and electrical requirements imposed on materials by increasingly complicated device technology. Epitaxial films of III-V compounds such as gallium arsenide, a compound having excellent potential for application in semiconductor and related technology, have been grown on crystalline substrates by chemical vapor deposition (CVD), by flash evaporation, and by sputtering techniques. Vacuum evaporation techniques have also been of interest, in part because of the potential of these techniques for achieving high film purity. Additionally, vacuum evaporation techniques have potential simplicity of operation in that extraneous chemical reactants, carrier gases and so forth may not be required.

As is well known, the physical, thermal and electrical characteristics of single crystal sapphire ($\alpha$-$Al_2O_3$) make it an excellent substrate material. Accordingly, it is desirable to utilize the potential advantages of vacuum evaporation techniques to grow epitaxial monocrystalline films of III-V compounds such as gallium arsenide on sapphire substrates.

A vacuum evaporation technique for depositing gallium arsenide films onto crystalline substrates is taught in U.S. Pat. No. 3,476,593 to William I. Lehrer. This technique utilizes separate sources of gallium oxide and arsenic and maintains the substrate temperature within the preferred range 550°–600°C. The use of this technique to grow epitaxial monocrystalline gallium arsenide is limited to substrate materials having a crystal lattice and lattice constants similar to those of gallium arsenide, specifically, monocrystalline germanium and silicon.

The use of vacuum evaporation techniques to grow epitaxial gallium arsenide films on monocrystalline substrates has also been reported by John E. Davey and Titus Pankey, in the Journal of Applied Physics, Vol. 39, No. 4, pp. 1941–48, (March 1968). A modified three-temperature zone technique employing argon bombardment and post-anneal was used. This was a relatively complicated technique that required separate sources of gallium and arsenic as well as separate heaters and temperatures for the two sources and the substrate. The authors were unsuccessful in a brief attempt to use this technique to grow epitaxial monocrystalline gallium arsenide on alumina substrates that were prepared using standard polishing and etching techniques.

A modification of the three-temperature technique in which Group III and Group V molecules are supplied from a molecular beam directed at the substrate has been used by J. R. Arthur and J. J. LePore for the vacuum growth of gallium arsenide and gallium phosphide on substrates of the same compounds. See the Journal of Vacuum Science Technology, Vol. 6, p. 545, ff (1969). In addition, U.S. Pat. No. 3,615,931 to J. R. Arthur teaches the epitaxial growth of films of III-V compounds by directing molecular beams containing the III–V compounds at a substrate heated to 450°–650°C. However, while the molecular beam technique incorporates some of the features of vacuum evaporation, the use of molecular beams presents complicated equipment and operational requirements that are absent in vacuum evaporation. Also, although U.S. Pat. No. 3,615,931 includes sapphire in a list of commercially available substrate materials that are suitable for use with the molecular beam technique, the patent teaches that the suitable substrate materials are those having lattice constants closely related to the film material. For gallium arsenide films, specific application of the technique was limited to gallium arsenide substrates. Also, there is no teaching of a single source of film material.

As may be appreciated, it is desirable to realize the potential advantages of vacuum evaporation for simplicity of operation and film purity in growing epitaxial, monocrystalline III–V compound semiconductors such as gallium arsenide on insulative substrates, including substrates of structurally dissimilar compounds such as sapphire.

SUMMARY OF THE INVENTION

A method of depositing an epitaxial, monocrystalline film of gallium arsenide upon a monocrystalline insulating substrate comprises the steps of: (1) polishing a surface of the substrate to a smooth finish; (2) etching the surface to a smooth, clean finish; (3) heating the substrate to a temperature within the approximate range 580°–595°C at subatmospheric pressure; and (4) heating gallium arsenide to 900°–1000°C at subatmospheric pressure to evaporate gallium and arsenic from the source and to recombine the gallium and arsenic as stoichiometric gallium arsenide upon the surface of the heated substrate. Typically, the subatmospheric pressure is within the range $10^{-5}$ to $10^{-8}$ torr.

DETAILED DESCRIPTION

Figure 1:
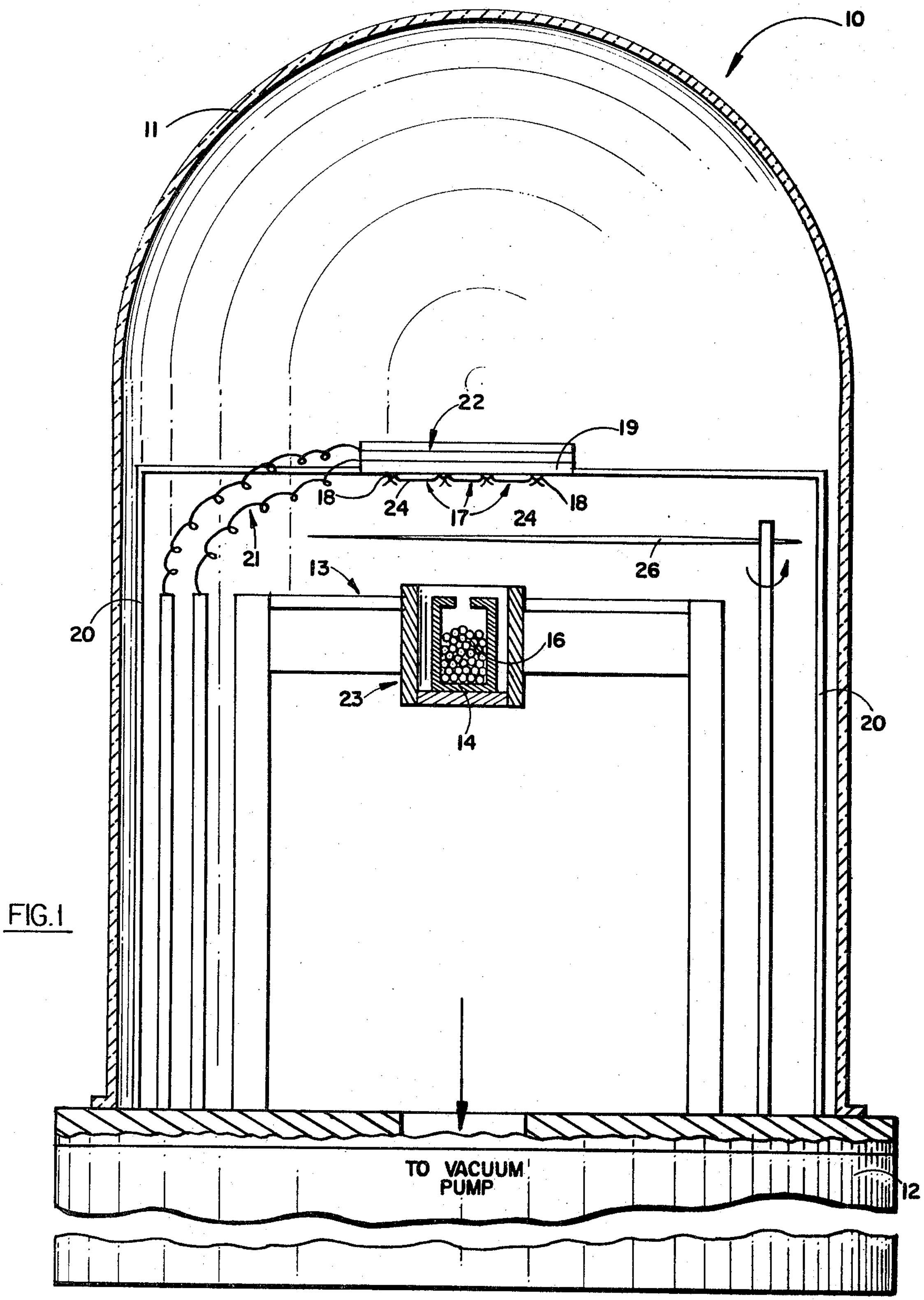
FIG. 1 is a front elevational view, partly in section, of a vacuum evaporation system for growing monocrystalline films of materials on monocrystalline substrates.

Shown in FIG. 1 is one embodiment of a vacuum evaporation system, designated generally by the reference numeral 10, that may be used in practicing the method of the present invention. The system 10 includes an enclosure 11, such as a glass bell jar, that is supported by a base 12 and can be evacuated in a known manner by a vacuum pump (not shown). Mounted within the enclosure 11 is a holder 13 for a crucible 14 containing a single source 16 of a Group III–V compound such as gallium arsenide. As used here, the term "single source" indicates a compound containing both gallium and arsenic, in contrast to separate sources of gallium and arsenic, and encompasses a plurality of crucibles of the single source compound. One or more substrates 17 may be secured by clips 18 to a holder 19 that is mounted proximate to and above the crucible 14 and source 16 by standards 20. A substrate thermocouple system 21 is is used in conjunction with a suitable power supply (not shown) for controlling the operation of a substrate heater 22 to control the temperature of the substrates 17. Likewise, a suitable power supply and thermocouple (not shown) and a heater 23 are used to control the temperature of the crucible 14 (and the source 16).

To practice the method of the present invention, monocrystalline substrates 17 are (1) cut to the desired crystallographic orientation and polished; (2) etched; and (3) brought to the desired temperature at subatmospheric pressure within the vacuum evaporation system 10; and then (4) the crucible 14 and source 16 are heated at subatmospheric pressure to a temperature and for a time sufficient to deposit a desired thickness of gallium arsenide on the substrates.

In carrying out the first step of the present invention, each planar single crystal substrate 17 is cut so that a surface 24 thereof closely approximates the crystallographic plane chosen for deposition. For monocrystalline film growth, the surface 24 is preferably within one degree of the deposition plane.

Continuing with step one, because the substrate surface smoothness is important in achieving heteroepitaxial monocrystalline growth, the substrate 17 is polished sufficiently to remove substantially all surface roughness, including polishing scratches. Preferably, the polished substrate is then washed in a suitable solvent to remove grease and residue deposited during the polishing.

According to step two, and immediately prior to step three, the substrate 17 is etched to strip contaminants and polishing residue from the surface 24. After etching, the substrate 17 is rinsed in distilled water, washed in boiling methyl alcohol and air dried.

In carrying out step three, the substrate 17 is secured to the substrate holder 19 with the deposition surface 24 facing the crucible 14. Typically, polycrystalline gallium arsenide chunks that have been etched to remove any surface impurities are placed in the crucible 14 to serve as the source 16. Then, the vacuum pump (not shown) is activated to evacuate the enclosure 11 to a desired equilibrium base pressure and the substrate heater 22 is activated to bring the substrate 17 to equilibrium at the desired operating temperature.

Step four is initiated by actuating the crucible heater 23 to elevate the temperature of the crucible 14 and source 16 to a range suitable for evaporation of gallium and arsenic. Step four is normally initiated concurrently with, or subsequent to, the heating of the substrate 17 because earlier heating of the source might tend to prematurely deplete the arsenic. Although the preferred gallium arsenide source temperature is 900° to 1000°C, higher or lower temperatures may be utilized with satisfactory results. A shutter 26 is interposed between the crucible 14 and the substrate 17 until thermal equilibrium is attained, thereby precluding premature deposition on the substrate.

The mechanism of deposition in the present invention is the evaporation of Ga and $As_2$ from the single heated source 16 and the recombination thereof as GaAs at the substrate surface 24. At a typical source 16 temperature of about 1000°C, the vapor pressure ratio of the Ga and $As_2$, $P_{As2}/P_{Ga}$, is approximately 60. Consequently, Ga atoms and an excess of $As_2$ molecules are supplied to the substrate. However, the present invention utilizes the fact that the reaction kinetics of Ga and $As_2$ are controlled at the substrate to attain stoichiometric GaAs films, as described subsequently. This is accomplished using the evaporation of GaAs from a single source without the introduction of extraneous chemical reactants, carrier gases and so forth.

As is known in the art, the condensation coefficient of Ga is approximately unity and the surface concentration thereof is temperature dependent above about 477°C. In contrast, $As_2$ molecules normally have a very low condensation coefficient for a GaAs surface. However, if absorbed Ga is present, the $As_2$ condensation coefficient is proportional to the amount of Ga. Then, if Ga and an excess of $As_2$ are supplied to the substrate, as by evaporation from GaAs, a substantial percentage of the number of Ga atoms and a corresponding number of $As_2$ molecules are retained at the substrate surface, while the excess $As_2$ is reflected. That is, stoichiometry is attained.

The relative effect of various parameters on the success of the instant vacuum evaporation method is uncertain. However, it is believed that the effect of each of the various preparation and deposition steps is important to achieving deposition of monocrystalline GaAs. Thus, the substrate polishing and etching techniques, the substrate deposition temperature (particularly in terms of the reaction kinetics created by the substrate temperature), and the deposition rate are deemed significant.

EXAMPLES

The Table infra summarizes the termperatures applied to various samples and the results obtained using the method of the present invention. Although the method is described specifically for the heteroepitaxial growth of gallium arsenide films on sapphire substrates, it is applicable in general to III–V or II–VI compound films. Additionally, the substrates may comprise other materials, including metallic oxides such as spinel ($MgAl_2O_4$) and beryllia (BeO), which are structurally either similar or dissimilar to the film.

As mentioned above, the method of the present invention is suited for growing films on substrates of different crystal structure. As used here, the term "crystal structure" is defined to include crystal lattices and lattice constants. The examples specifically concern films or layers of gallium arsenide (face centered cubic, zincblende arrangement; $a$ = 5.65 A.) on sapphire (rhombohedral symmetry, distorted hexagonal packing with $a_o'$=4.76A. $c_o'$ = 13.00 A.).

TABLE

| SAMPLE NO.[a] | | SUBSTRATE TEMPERATURE,°C | STRUCTURAL CHARACTERISTICS OF GROWN GaAs FILM[a] | |
|---|---|---|---|---|
| A | C | | A | C |
| 1 | | 200 | Amorphous | |
| 2 | | 300 | Polycrystalline | |
| 3 | | 312 | do. | |
| 4 | | 480 | Polycrystalline | |
| | 4 | 480 | | Polycrystalline |

TABLE – Continued

| SAMPLE NO.[a] A | SAMPLE NO.[a] C | SUBSTRATE TEMPERATURE,°C | STRUCTURAL CHARACTERISTICS OF GROWN GaAs FILM[a] A | STRUCTURAL CHARACTERISTICS OF GROWN GaAs FILM[a] C |
|---|---|---|---|---|
| 5 | | 484 | do. | |
| | 5 | 484 | | do. |
| 6 | | 486 | do. | |
| 7 | | 501 | Polycrystalline with monocrystallinity | |
| 8 | | 546 | Monocrystalline with trace of polycrystallinity | |
| | 8 | 546 | | Polycrystalline |
| 9 | | 552 | Monocrystalline with trace of preferred orientation | |
| 10 | | 584 | Monocrystalline | |
| 11 | | 589 | do. | |
| | 11 | 589 | | do. |
| 12 | | 600 | Monocrystalline with trace of polycrystallinity | |

[a] "A" indicates in-house polished substrates
"C" indicates commercially polished substrates Verneuil-grown, monocrystalline sapphire substrates 17 were cut to about 0.015 inches thickness, with {0001} planes within one degree of the deposition surfaces 24. Surface roughness and imperfections may be critical to any failure to achieve monocrystalline gallium arsenide films. To avoid such failure, and to more precisely establish the effect of temperature on epitaxial growth, at least one substrate having a smooth, "A" polish deposition surface 24 was used for each substrate temperature investigated. The A polishing sequence comprised polishing the deposition surface 24 with successively finer diamond paste to 1.0 micron and then finish polishing with 0.3 micron Linde A alumina.

After polishing, the substrates 17 were degreased in trichloroethylene. Then, according to step two, the substrates were etched in an etchant solution comprising a 2:9 mixture of $HF:HNO_3$ to remove surface impurities. As mentioned previously, the substrates were then rinsed in distilled water, washed in boiling methyl alcohol, and air dried.

According to a substep of step two, surface impurities were removed from the polycrystalline gallium arsenide chunks that were used as the source 16. As an example, the chunks were prepared by etching for about one minute in a solution of methanol plus one percent bromine, then rinsing in boiling methanol and air drying.

In carrying out step three, the polished and etched sapphire substrates 17 and the etched gallium arsenide single source 16 were positioned, respectively, on the holder 19 and within the crucible 14. The vacuum pump (not shown) was then activated to evacuate the enclosure 11 to an equilibrium base presssure of approximately $10^{-5}$ to $10^{-8}$ torr. As the enclosure 11 approached equilibrium subatmospheric pressure, the substrate heater 22 was activated to elevate the substrates 17 and, more importantly, their surfaces 24 to a temperature within the investigative range of 200°–600°C. Using the simple thermocouple-controlled heater 22 in FIG. 1, the substrate temperatures were easily maintained at within a degree of the desired equilibrium temperature.

The crucible heater 23 used for step four was a tantalum shielded tungsten wire basket which maintained the source 16 within a suitable evaporation range of 900°–1000°C. Using a substrate 17 temperature of about 590°C, a substrate-to-source distance of about two centimeters, and a source 16 temperature of about 1000°C, the vacuum evaporation system 10 achieved GaAs deposition rates of about 0.1 to 0.15 microns per minute.

The structure of the GaAs films was evaluated using reflection electron defraction (RED) at 75 kv. with the electron beam at an angle of one degree relative to the film surfaces. The RED results indicated the grown crystalline films were all pure, stoichiometric gallium arsenide.

The structures of four films grown on commercially polished substrates, hereinafter termed "C" films, were evaluated using RED. The "C" films, which were grown for the substrate temperature range of 480°–589°C, are listed in the Table as sample No.'s. 4C, 5C, 8C and 11C corresponding to temperatures of 480°, 484°, 546°, and 589°C. The C films were primarily polycrystalline with some preferred orientation.

In contrast to the C films, most of the finely polished A films exhibited a tendency toward increased quality, i.e., monocrystallinity, for increasing temperatures to about 600°C, with {111} planes growing parallel to the (0001) deposition plane of the substrate. Film sample number 1A, grown at a substrate equilibrium temperature of 200°C, was amorphous. For the range 300°–486°C, the gallium arsenide films 2A-6A were polycrystalline. Film samples 7A, 8A and 9A for 501°C, 546°C and 552°C were, respectively, predominately polycrystalline, predominately monocrystalline, and almost entirely monocrystalline. At 584°C and 589°C, the film samples 10A and 11A were entirely monocrystalline.

Sample 12A (600°C) was similar to sample 8A (546°C) in that it was substantially monocrystalline with traces of polycrystallinity.

Based upon the above-described characteristics of the grown films, it is conservatively estimated that monocrystalline gallium arsenide films were achieved for the substrate temperature range of about 580°–595°.

RED indicated twinning in certain <111> directions. However, the twin density is lowered considerably by the method of the present invention and is sufficiently low to preclude deleterous effects on the functioning of devices fabricated from the gallium arsenide on sapphire samples. In addition, twin densities would decrease with further refinements which are within the scope of the present invention. For example, the nucleation process that initiates film growth on the substrate could be at a given temperature, with subsequent growth at a higher (or lower) temperature. Alternatively, the deposition rate could be varied during growth. Other alternatives include post growth annealing, thermal cycling, and combinations of the above.

The quality of the gallium arsenide films was also checked using Laue back reflection X-ray diffraction and unfiltered copper radiation. The results were considered to be in agreement with the RED results, although the indicated film quality was not as consistently good at temperatures other than 584° and 589°C. This difference in results is not unexpected however. This is because films are frequently of better quality near the surface and the RED findings are indicative of the quality within several hundred angstroms of the surface of the film, while X-ray diffraction represents a sampling of the entire film body. It would thus seem that the gallium arsenide films exhibit the characteristic of enhanced crystallographic quality at the surface.

Thus, there has been described a method of forming a layer of monocrystalline III-V compound on a substrate having a crystal structure dissimilar to the crystal structure of the layer. Preferred compounds, temperatures and the like have been described. Alternative compounds and parameters have been indicated. The scope of the invention is limited, however, only by the claims appended hereto and equivalents thereto.

Having thus described a preferred embodiment of the invention, what is claimed is:

1. A method of forming a layer of monocrystalline gallium arsenide on a monocrystalline substrate having a dissimilar crystal structure, comprising:

removing a sufficient thickness of substrate mateial from at least one surface of the substrate to define a substantially smooth surface;

etching said surface to define a clean surface finish;

heating a single source of gallium arsenide at a subatmospheric pressure of approximately $10^{-5}$ to $10^{-8}$ torr to evaporate gallium and arsenic; and heating the substrate at the subatmospheric pressure to a temperature sufficient to condense stoichiometric gallium arsenide on said one surface of said substrate.

2. A method as defined in claim 1, wherein the substrate temperature is within the approximate range 550°–600°C.

3. A method as defined in claim 1, wherein the substrate temperature is within the approximate range 580°–595°C.

4. A method as defined in claim 1 wherein the substrate is sapphire.

5. A method as defined in claim 1 wherein the substrate is $MgAl_2O_4$.

6. A method as defined in claim 1 wherein the substrate is BeO.

7. A method of forming a layer of monocrystalline gallium arsenide on a monocrystalline sapphire substrate, comprising:

polishing at least a surface of the substrate;

etching the polished surface to a smooth, clean finish;

heating the etched surface of the substrate to a temperature of approximately 580°–595°C at a subatmospheric pressure of approximately $10^{-5}$ to $10^{-8}$ torr.; and heating a single source of gallium arsenide at the subatmospheric pressure range and in the presence of the heated substrate to evaporate gallium and arsenic from the single source for recombination on the substrate surface.

8. A method of forming a layer of monocrystalline gallium arsenide on a monocrystalline sapphire substrate as defined in claim 7, wherein the single source of gallium arsenide is maintained within the temperature range 900°–1000°C.

9. A method of epitaxially forming a layer of monocrystalline gallium arsenide as defined in claim 7, wherein the deposition surface of the substrate is a {0001} plane and gallium arsenide is formed with a plane of the type {111} parallel to the deposition plane.

10. A method of forming a layer of monocrystalline gallium arsenide on a monocrystalline sapphire substrate as defined in claim 7, wherein the polishing sequence comprises polishing said surface with successively finer diamond paste to approximately 1.0 micron, then finish polishing with approximately 0.3 micron alumina, and wherein the etching step utilizes an etchant solution comprising an approximately 2:9 mixture of $HF:HNO_3$.

* * * * *

PO-1050
(5/69)

UNITED STATES PATENT OFFICE
CERTIFICATE OF CORRECTION

Patent No. 3,864,162 Dated February 4, 1975

Inventor(s) Joseph L. Kenty

It is certified that error appears in the above-identified patent and that said Letters Patent are hereby corrected as shown below:

Item [22] after "Filed:", change "Feb. 4, 1975" to --July 16, 1973--.

Signed and sealed this 15th day of April 1975.

(SEAL)
Attest:

RUTH C. MASON
Attesting Officer

C. MARSHALL DANN
Commissioner of Patents and Trademarks